United States Patent [19]

Gallo

[11] Patent Number: 5,154,976
[45] Date of Patent: Oct. 13, 1992

[54] FLAME RETARDANT EPOXY MOLDING COMPOUND, METHOD AND ENCAPSULATED DEVICE

[75] Inventor: Anthony A. Gallo, Olean, N.Y.

[73] Assignee: Dexter Corporation, Windsor Locks, Conn.

[21] Appl. No.: 692,749

[22] Filed: May 22, 1991

Related U.S. Application Data

[60] Division of Ser. No. 418,757, Oct. 5, 1989, Pat. No. 5,041,254, which is a continuation-in-part of Ser. No. 258,574, Oct. 17, 1988, abandoned.

[51] Int. Cl.$^5$ .................................................. B32B 27/38
[52] U.S. Cl. ..................................... 428/413; 428/417; 428/418; 428/921
[58] Field of Search ................. 428/413, 417, 418, 921

[56] References Cited

U.S. PATENT DOCUMENTS

| | | | |
|---|---|---|---|
| 4,042,500 | 8/1977 | Tuller | 260/280 P |
| 4,150,068 | 4/1979 | Taniyama | 524/121 |
| 4,282,136 | 8/1981 | Hunt | 525/481 |
| 4,710,796 | 12/1987 | Ikeya | 357/72 |

OTHER PUBLICATIONS

Moltzman et al.; "Evolution of Epoxy Encapsulation Compounds for Integrated Circuits: A User's Perspective"; Polymers for High Technology; 1987; pp. 521-536.

*Primary Examiner*—Jenna L. Davis
*Attorney, Agent, or Firm*—Pennie & Edmonds

[57] ABSTRACT

An improved flame retardant epoxy molding compound comprises an epoxy, a hardener preferably of the novolac or anhydride type, a catalyst, a mold release agent, preferably a filler, preferably a colorant, preferably a coupling agent, an organic compound containing a higher percent of halogen (which can be part of the resin or the hardener), preferably the polyglycidyl ether of the bromophenol-formaldehyde novolac type, preferably containing at least about 1.0% of bromine by weight of the molding compound, a lower percent of sodium, preferably in the range of 0.03–0.06% by weight of the antimony pentoxide, a lower percent of antimony pentoxide, preferably in the range of ≦ about 0.8% by weight of the molding compound, and an amount of bismuth trioxide ≦ about 4.0% by weight of the molding compound.

The improved flame retardant epoxy molding compounds when used to encapsulated semiconductor devices have improved high temperature stability and compatibility, ball-lift performance, live-device performance, cost and lower toxicity compared to similar prior art molding compounds.

7 Claims, 7 Drawing Sheets

FLAME RETARDANT EPOXY MOLDING COMPOUND, METHOD AND ENCAPSULATED DEVICE

CROSS REFERENCES TO RELATED APPLICATIONS

This application is a divisional application of Ser. No. 07/418,757 filed Oct. 5, 1989, U.S. Pat. No. 5,041,254 which in turn is a continuation-in-part of application Ser. No. 07/258,574 filed Oct. 17, 1988, now abandoned.

BACKGROUND OF THE INVENTION

1. Technical Field

The present invention relates to an improved method of encapsulating a semiconductor device by heat curing an encapsulating compound comprising an epoxy, a hardener, a catalyst, a mold release agent, optionally a filler, optionally a colorant, optionally a coupling agent and a flame retardant system around a semiconductor device.

In the improvement, the flame retardant system comprises a lower percentage of antimony pentoxide, a lower percentage of sodium and an organic compound containing a higher percentage of halogen than prior art molding compounds.

In the improvement, molding compounds with an organic compound containing a higher percentage of halogen along with a lower percentage of antimony pentoxide and sodium have the unexpected results of releasing less free bromine ion upon heat aging and water extraction than prior art molding compounds. Also when the improved molding compounds were molded onto a semiconductor device, they exhibit unexpected superior high temperature stability and compatability, ball lift and live device performance.

The present invention also relates to improved flame retardant thermosetting epoxy molding compounds of the type comprising an epoxy, a hardener, a catalyst, a mold release agent, optionally a filler, optionally a colorant, optionally a coupling agent and a flame retardant system wherein the flame retardant system comprises a lower percentage of antimony pentoxide, a lower percentage of sodium, an organic compound containing a higher percentage of halogen than prior art molding compounds and optionally a basic metal oxide to reduce corrosion of metal conductor lines and pads of the semiconductor device.

The present invention also includes an improved encapsulated semiconductor device wherein the encapsulant is as described above, with as flame-retardant system comprising a lower percentage of antimony pentoxide, and sodium, an organic compound containing a higher percentage of halogen than prior art molding compounds and optionally a basic metal oxide to reduce corrosion of metal conductor lines and pads of the semiconductor device.

In all three instances the halogen-containing organic compound may be a separate ingredient, but is preferably a part of either the epoxy or the hardener. The halogen containing organic compounds can also be halogen-containing compounds which become chemically incorporated into the product of the epoxy resin and the hardener upon setting or part of other ingredients such as the lubricant or the colorant.

The term "epoxy molding compounds" as used herein means epoxy molding compound conventionally known in the art including any material containing two or more reactive oxirane groups. For example, the epoxy molding compound may have two or more epoxy groups in one molecule, including glycidyl ether type such as bisphenol A type, phenol novolac type, cresol novolac type and the like; glycidyl-ester type; alicyclic type; heterocyclic type and halogenated epoxy resins etc. The epoxy resins may be used either singly or as a mixture of two or more resins.

Similarly, the term "epoxy novolac molding compound" as used herein includes any phenol-derived and substituted phenol derived novolac hardener conventionally used as hardener for epoxy resins. For example, phenolic novolacs, cresolic novolacs and Bisphenol A derivatives are suitable. The epoxy novolac molding compounds may be used either singly or as a mixture of two or more compounds.

The term "catalyst" as used herein means a catalyst appropriate to the hardener used to promote the curing of the present composition. Such catalysts include basic and acidic catalysts such as the metal halide Lewis acids, e.g., boron trifluoride, stannic chloride, zinc chloride and the like, metal carboxylate-salts such as stannous octoate and the like; and amines, e.g., triethylamine, imidazole derivatives and the like. The catalysts are used in conventional amounts such as from about 0.1 to 5.0% by weight of the combined weight of epoxy and hardener.

The term "mold release agents" as used herein means chemical agents commonly used to assist the release of the cured epoxy molding compounds from the mold. For example, carnauba wax; montanic acid ester wax; polyethylene wax; polytetrafluoroethylene wax; glyceral monostearate; metallic stearates; paraffin waxes and the like are suitable.

The term "fillers" as used herein means one or more of the conventional fillers such as silica, calcium carbonate, calcium silicate, aluminum oxide, glass fibers, clay, and the like. The preferred filler is silica or a mixture of predominantly silica with other filler(s). The fillers usually are used in at least 50 percent by weight of the molding compound.

The term "colorant" as used herein includes colorant commonly used in epoxy molding compound, such as carbon black, pigments, dyes and the like.

The term "coupling agent," as used herein means a coupling agent known to improve wet electrical properties of the compound. The coupling agents may be of the silane type, characterized by the formula $R'Si(OR)_3$; where $R'$ represents an organo-functional group such as amino, mercapto, vinyl, epoxy or methacryloxy, and OR represents a hydrolyzable alkoxy group attached to the silicon. Preferred coupling agents are described in U.S. Pat. Nos. 4,042,550 and 3,849,187, of which the descriptions are incorporated herein by reference.

The term "halogen-containing organic compound" or "organic compound containing halogen", as used herein, includes organic compound in which the halogen is present from any source including halogenation of a component or its precursor (such as a monomer) or by addition of halogen-containing monomers by reactions in which the halogen is not completely removed.

The halogen-containing organic compound used in a flame retardant system is preferably of the reactive type and further preferably has, as halogen, chlorine or bromine. Exemplary halogenated organic compounds are those types of polyglycidyl ether of bromophenol-formaldehyde novolac, commercially sold by Nippon Kayaku under the tradename "Bren ™" and is of the general formula I:

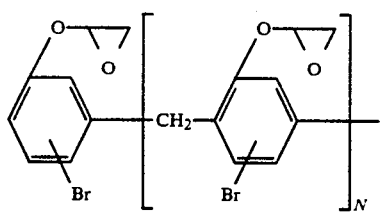
(I)

Other exemplary halogenated organic compounds are described in U.S. Pat. Nos. 4,042,550 and 4,282,136, of which the descriptions are incorporated herein by reference and include halogenated bisphenol A and derivatives of bisphenol A such as tetrabromobisphenol A. Additional examples of reactive halogenated organic compounds which are a part of the epoxy resins are glycidyl ethers of halogenated resins such as the diglycidyl ether of tetrabromobisphenol A.

The halogen containing organic compound may be a separate additive or may be contained in one or more of the organic components of the molding compound, especially the epoxy or the hardener, or possibly other components such as the lubricant, or the colorant or the filler (if organic).

Exemplary of reactive halogen-containing organic compounds which are part of the hardener are halogenated anhydrides such as tetrabromo and tetrachlorophthalic anhydride. Tetrabromobisphenol A and other such halogenated monomers may also be considered part of the hardener, especially the phenol-derived or substituted phenol-derived hardener.

The term "antimony pentoxide" as used herein means antimony pentoxide in any available form. Preferably, antimony pentoxide used is Nyacol A1590 commercially sold by the Nyacol Division of P.Q. Corporation which has a very low sodium content of 0.03 to 0.06% by weight of the antimony pentoxide as compared to that of 3 to 4% in prior art products such as Nyacol A1588LP.

The term "basic metal oxide" as used herein means any metal oxide in any available form capable of neutralizing the acidity of the antimony pentoxide and thereby reducing the corrosion of the metal semiconductor device lines and pads, especially in regions where two different metals are in contact with each other. Preferably, the basic metal oxide is bismuth trioxide ($Bi_2O_3$).

2. Description of Background Art

Epoxy resin compounds have often been used for encapsulation of semiconductor or device such as integrated circuits (IC), large scale integrated circuits (LSI), transistors and diodes, etc., or other electronic components. Such encapsulants generally comprise an epoxy, a hardener, a catalyst, a mold release agent, optionally a filler, optionally a colorant and sometimes a coupling agent.

Exemplary formulations of these ingredients are described in U.S. Pat. Nos. 4,710,796 to Ikeya et al., 4,282,135 to Hunt et al., U.S. Pat. No. 4,042,550 and references cited therein. Recently, the electronic industries require these epoxy molding compounds be flame retardant. Additives including halogenated compounds, transition metal oxides and hydrated alumina to improve the flame retardancy, as measured for example by Underwriters Laboratory Test 94V-0 of 1/16" bar have been reported. However, at high temperatures, these flame retardant additives detract from the compatibility of the encapsulant with semiconductor devices.

U.S. Pat. No. 4,710,796 to Ikeya et al. teaches a resin for encapsulating semiconductor device comprising an epoxy resin, curing agent, organic phosphine compound and at least one antimony oxide.

U.S. Pat. No. 4,042,550 teaches epoxyanhydride molding compounds with secondary fillers including antimony trioxide or antimony tetraoxide and halogenated compounds in flame retardant systems.

Similarly, U.S. Pat. No. 4,282,136 to Hunt et al. describes the use of synergistic flame retardants consisting of halogen-containing organic compounds and antimony pentoxide. The reference teaches that an encapsulant employing such a flame retardant system, when used to encapsulate a semiconductor device, has improved high temperature compatibility compared to similar molding compounds with antimony trioxide or antimony tetraoxide. However, the prior art epoxy molding compounds contains a high percent of sodium which is known to cause poor performance in semiconductor devices due to current leakage. See Moltzan et al., The Evolution of Epoxy Encapsulation Compounds For Integrated Circuits: A User's Perspective, Polymer for High Technology Electronics and Protronics, ACS Sym. Series No. 346, p. 521, Sep. 7-12, 1986.

While the prior art flame retardant combinations provides reasonable flame retardance and satisfactory compatibility on electronic devices, a need clearly exists for flame retardant epoxy molding compounds of all types with improved compatibility, performance, cost and lower toxicity.

Accordingly, it is an object of the present invention to provide an improved flame retardant thermosetting epoxy molding compound.

It is yet another object of the present invention to provide an improved method of encapsulating a semiconductor device.

It is yet another object of the present invention to provide an improved encapsulated semiconductor device.

These and other objects of the invention, as well as a fuller understanding of the advantage thereof, can be had by reference to the following descriptions and claims.

SUMMARY OF THE INVENTION

The foregoing objects are achieved according to the present invention by an improved epoxy molding compound comprising:

(a) about 5-25 percent by weight of compound of an epoxy;

(b) about 4-20 percent by weight of compound of a phenol-derived or a substituted phenol derived resin hardener;

(c) an effective amount of a catalyst for the reaction between said epoxy resin and said hardener in an amount of from about 0.1 to 10% by weight of the combined weight of epoxy and hardener;

(d) an effective amount of a mold release agent for the release of the cured molding compound from a mold in an amount of between about 0.01 and about 2 percent by weight of composition;

(e) between about 50 and 85 percent by weight of composition of a filler; and (f) a flame retardant system of:
  (1) ≦about 0.8% antimony pentoxide by weight of molding compound;
  (2) from about 0.01-1% sodium by weight of antimony pentoxide; and
  (3) a reactive organic compound containing at least about 1.0% of bromine by weight of molding compound which may include one or more of the other components; and
  (4) ≦about 4.0% by weight of molding compound of a basic metal oxide which is most preferably bismuth trioxide.

Accordingly, Table 1 below summarizes the improved epoxy molding compounds.

TABLE 1

| Description Formulation A: | Range (%) | Preferred Range (%) |
|---|---|---|
| Epoxy Cresol Novolac resin | 5-25 | 10-16 |
| epoxy resin (preferably BREN TM)-containing bromine (%) | at least about 1.0 | 1.0-1.8 |
| sodium (present in the antimony pentoxide) | 0.01-1 | 0.03-0.06 |
| antimony pentoxide | ≦0.80 | 0.40-0.80 |
| bismuth trioxide | ≦4.0 | 1.60-3.20 |
| Carbon black colorant | 0.05-0.5 | 0.1-0.5 |
| phenol Novolac Hardener | 4-20 | 4-12 |
| Fused Silica (SiO$_2$) filler | 50-85 | 60-80 |
| silanes | 0.05-2.0 | 0.1-1.5 |
| catalysts | 0.01-10.0 | 0.5-2.0 |
| wax lubricants | 0.01-2 | 0.02-1.0 |

The improved epoxy molding compounds of the present invention are suitable for use in encapsulating a semiconductor device.

According to the present invention, the said improved epoxy molding compounds may be prepared by any conventional method. For example, the ingredients may be finely ground, dry blended and then densified on a hot differential roll mill, followed by granulation. Generally, the ingredients (or any portion of them) may be prepared as a fine powder, fed directly into a compounding device such as an extruder prepared as a premix of raw materials. If less than all of the ingredients are present in the initial form, the remainder of the ingredients can be added prior to or during densification.

Densification can be by mechanical compacting using a preformer or a combining mill in the case of a fine powder, or by an extruder or differential roll mill in the case of the fine powders, direct feed or premix. Premixes or densified forms (such as preforms and granular forms), containing less than all of the ingredients can also be fed to the ultimate mold in the system with the remaining ingredients in a similar or different form.

The present invention includes flame retardant molding compounds in any physical form or even as systems of two or more components. Where two or more components are used, one should contain the epoxy, the other the hardener. Preferably, the catalyst is in the hardener component to avoid catalyzed homopolymerization of the epoxy.

In a preferred embodiment, in the laboratory, the dry ingredients of the formula are preground to a fine powder and then mixed in a large plastic bag. The liquid ingredients (i.e., the silane coupling agents) are added to dry ingredients and the mixture is mixed again by hand. The mixture is then treated on a large two-roll mill (one roll heated to ~90° C. and the other cooled with tap water) until a uniform sheet (~6" wide by 24" long) is obtained. The sheet is allowed to cool and then ground to a fine powder.

In another preferred embodiment, in the pilot plant and during large scale production, the dry ingredients are mixed in a large hopper, the liquid ingredients are added in a homogeneous manner to ensure blending, and mixing continues. This mixture is then extruded (with heating) to give a continuous sheet which is cooled and grounded. The final ground powder can be used as is, or compacted (densified) in a preformer to give tablets (performs) of desired shape and size.

These compounds may be molded into various articles by application of the appropriate temperature and pressure. For example, molding conditions for the encapsulated semiconductor of the present invention may range from about 300° to 400° F., (about 149°-204° C.), preferably about 350° to about 375° F., (about 177°-191° C.), at 400 to 1,500 psi, (about 28-105 kg/cm$^2$), for a time ranging from about 30 to 120 seconds, preferably 60 to 90 seconds.

Any suitable molding apparatus may be employed, such as a transfer press equipped with a multi-cavity mold.

The ratio between the various ingredients may vary widely. In general, the epoxy will be in proportion to a novolac hardener so as to give a mole ratio of oxirane:-reactive hydroxy between about 0.8 and 1.25. Similarly, the epoxy will be in proportion to an anhydride hardener so as to give a ratio of oxirane:anhydride equivalent between about 1.0 and 1.7, preferably between about 1.11 and 1.25.

The catalyst employed is generally applied at levels sufficient to harden the epoxy molding compound under anticipated molding conditions. Amounts between about 0.1 and 5 weight percent (by combined weight of epoxy and hardener) are sufficient.

The mold release agent will be employed in amounts sufficient to give good release from the mold and also to improve the wet electrical properties of the encapsulated semiconductor device. Amounts between about 0.01 and 2 percent by weight of total compound, preferably between about 0.02 and 1 percent by weight of total compound can be used.

The total amount of filler may range from 0 up to about 85 percent of the total compound. Preferably, the filler comprises a total of more than 50 weight percent of the total compound and more preferably between about 60 and about 85 weight percent of the total compound. Also, preferably, between about 60 and about 80 weight percent of the total compound is a silica filler.

Colorants, if employed, are generally in amounts sufficient to give encapsulated devices the desired color preferably black. Amounts between about 0.1-1.5% by weight of total compound can be employed.

Coupling agents, and in particular silane coupling agents, are provided in amounts sufficient to give the desired wet electrical properties and preferably between about 0.05 and 2 weight percent by total weight of compound, more preferably between about 0.1 and 1.5 weight percent by total weight of compound.

The epoxy molding compound obtained may be used to encapsulate semiconductor devices by any conventional method. For example, the preferred improved epoxy molding formulations comprising 0.4-0.8% percentage of antimony pentoxide; 0.03-0.06% sodium content (by weight of antimony pentoxide) and an organic compound containing about 1.0–1.8% of bromine when molded on test devices have unexpected superior thermal device compatibility, flameretardancy, ball lift property, live device performance compared to prior art formulations as disclosed in U.S. Pat. No. 4,282,136 to Hunt et al.

The use of a lower percentage of antimony pentoxide in the present invention is preferred because antimony pentoxide is expensive and toxic.

Improved epoxy molding formulations comprising 0.4–0.8 percent of antimony peroxide, 0.03–0.06 percent of sodium (by weight of antimony pentoxide) and an organic compound containing about 1.0–1.8 percent of bromine; when molded on test devices (autoclave) give superior ball lift test results. The ball lift (autoclave) test is routinely performed by semiconductor manufacturers to assess reliability of the devices in a humid environment. In the ball lift test, percent of ball bonds lifted when pulled and loss of bond strength as a function of the number of hours the devices held in an autoclave under two conditions (121° C., 15 psi steam and 135° C., 30 psi steam) are measured.

The improved epoxy molding formulations are uniquely effective in delaying or eliminating the "ball lift problem" in a molded semiconductor device. The improved epoxy molding compound shows no ball lift out to 1200 hours at both 15 and 30 psi while comparable sample with antimony trioxide shows 50% ball lift in 370 hours at 30 psi.

Further the improved epoxy molding compounds unexpectedly give superior live-device performance than the other combination of brominated resin and antimony trioxide/pentoxide. In the live-device performance test, National Semiconductor LF412 operational amplifiers are encapsulated with the improved epoxy molding compound. A group of about 40 of these molded packages (14 pin dual in-line) are subject to a high humidity environment (131° C., 100% relative humidity in an autoclave at 30 psi gauge pressure) with no bias. The parts are then pulled from the autoclave at regular intervals and examined for electrical failure (gain less than 7 or greater than 65).

Nineteen of the thirty eight National Semiconductor LF412 operational amplifiers encapsulated with the improved epoxy molding compound remain operational after 3036 hours of testing. On the other hand, nineteen of the thirty-eight operational amplifiers molded with comparable prior art compound containing 2.4 percent antimony pentoxide failed in less than 198 hours.

This is especially surprising in view of the prior art teaching that a higher percent antimony pentoxide ($\geq 1\%$) will give formulation with better synergistic performance. One skilled in the art of molding compound systems would not be lead to use $\leq$ about 0.8% antimony pentoxide because prior art teaches $\leq$ about 0.8% antimony pentoxide is expected to give poor flame retardancy and also insufficient to give improved "ball lift" performance.

It is well known in the art that the interaction of organic brominated species with the Au/Al intermetallic is the predominant failure mechanism, causing "ball lift" problems. (See Khan et al., Effect of High Thermal Stability Mold Material On the Gold-Aluminum Bond Reliability in Epoxy Encapsulated VLSI Devices, in Proc. IEEE. Paper presented at the Int. Reliability Physics Symp., pp. 40–49, April, 1988). Thus the use of an organic compound containing a higher amount of bromine, as flame-retardants, in molding compound compositions to give improved ball-lift and live device performance is unexpected.

The use of an organic compound containing a higher percent of bromine in the improved epoxy molding compound has the unusual properties of releasing less free bromine ion, upon heat aging and water extraction than prior art compounds.

The free bromine ion released from the molding compounds is determined by the "bromine extraction test." In the bromine extraction test, the molding compound is heat cured at 175° C. for 4 hours. The cured compound is then grounded and screened through 35-mesh sieve. The sieved compound is then heat aged at specific temperatures, preferably in the range from 200°–240° C. At specific intervals, small amounts of compound are removed. A one gram sample is then mixed with 100 ml of deionized water and reflux for 24 hours. The amount of free bromine ion extracted from the compound is then determined by ion chromatography.

In the present invention, after exposing the molding compounds at 200° C. for 500 hours, bromine ion extracted by water was 175 ppm for the device with the improved epoxy molding compound and 400 ppm for the prior art molding compound devices. At 240° C., after 500 hours, bromine extracted by water was 240 ppm for improved epoxy molding compound devices and 1000 ppm for prior art epoxy molding compound devices.

The present invention is not restricted to the above ingredients but may include other ingredients which do not detract from flame retardant properties of the flame retardant agent. Accordingly, other organic or inorganic materials may be added under the above conditions, including antimony trioxide and antimony tetraoxide in total amounts less than the amount of antimony pentoxide. Additionally, basic metal oxides such as bismuth trioxide may be added to further improve the live device performance of the encapsulated semiconductor devices.

DESCRIPTION OF PREFERRED EMBODIMENTS

Figure 1:
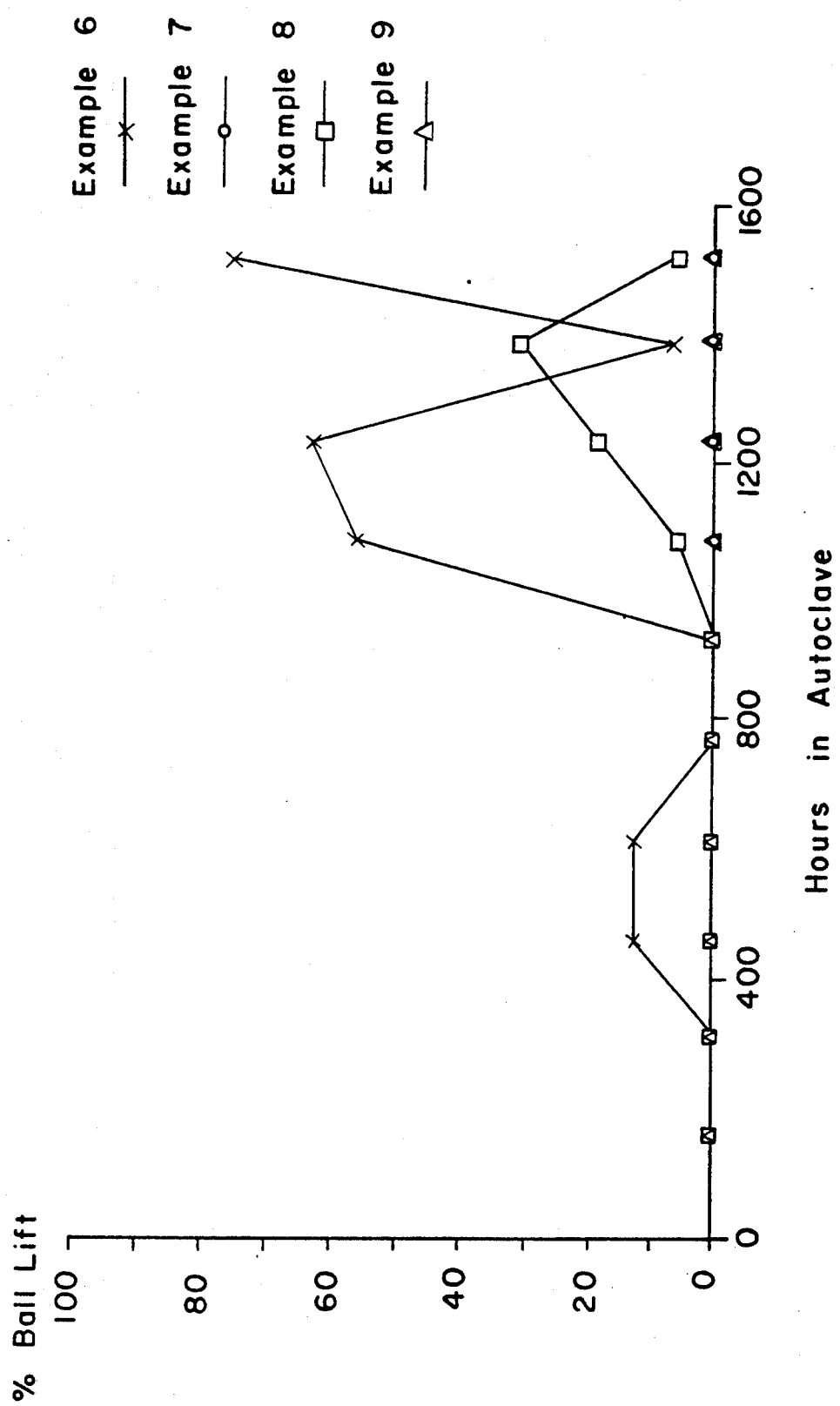
FIG. 1 describes test results of the ball lift (autoclave) test on molded devices (Examples 6–9) as a function of time and the estimated hours of 50% occurrence of ball lift at 15 psi.

The following nonlimiting examples further illustrate the present invention relating to an improved epoxy molding compound, method and encapsulated device. All parts are by weight unless indicated otherwise.

EXAMPLES 1-4

Epoxy encapsulants are prepared from the modified formulation A indicated in Table 2. The four groups of formulation differ in the presence/absence of antimony trioxide and/or brominated resin of the following type.

[Example 4], ball lift could not be detected out to 1300 hours at 15 psi.

EXAMPLES 6-9

A series of epoxy encapsulant compounds comparing the effectiveness of antimony pentoxide and trioxide as a flame retardant synergist are prepared in the laboratory then molded on test devices as indicated in Table 4.

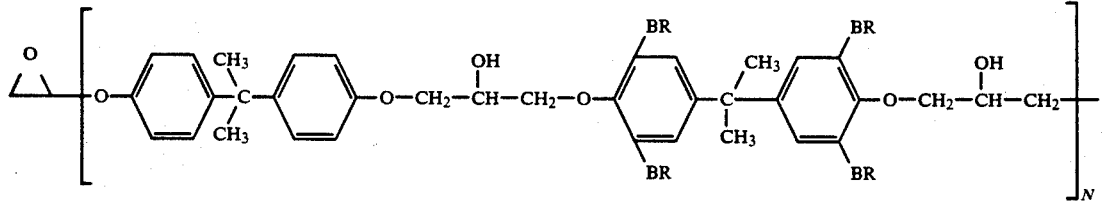

TABLE 2

| Description molding compound | Examples | | | |
|---|---|---|---|---|
| | 1 % | 2 % | 3 % | 4 % |
| Crystalline silica filler | 71.36 | 73.76 | 71.36 | 73.76 |
| Carbon black coloring | 0.23 | 0.23 | 0.23 | 0.23 |
| Phenol Novolac Hardener | 8.64 | 8.64 | 9.06 | 9.06 |
| Epoxy Cresol Novolac resin | 15.00 | 15.00 | 15.82 | 15.82 |
| Silane coupling agent | 0.48 | 0.48 | 0.48 | 0.48 |
| catalyst | 0.25 | 0.25 | 0.25 | 0.25 |
| wax lubricants | 0.40 | 0.40 | 0.40 | 0.40 |
| Brominated bis-A* type resin | 1.24 | 1.24 | — | — |
| antimony trioxide | 2.40 | — | 2.40 | — |

*A tetrabromobisphenol-A glycidyl ether resin with a softening point of 70-80° C. determined by Durran's method, an epoxy equivalent weight of 450-470, and 49 percent by weight of bromine.

EXAMPLE 5

The four compounds as described in Examples 1-4 are molded onto test devices and then subjected to the ball lift (autoclave) test. The test results as a function of time and the estimated hours to 50% occurrence of ball lift, or hours to 50% of initial bond-pull strength are summarized in Table 3.

TABLE 3

| | LS00 - Bond Strength and Ball Lift | | | |
|---|---|---|---|---|
| | Hours to 50% Pull Strength | | Hours to 50% Ball Lift | |
| psi | 15 psi | 30 psi | 15 psi | 30 |
| Examples | | | | |
| 1 | 540 | 230 | 460 | 160 |
| 2 | 1040 | 410 | 910 | 350 |
| 3 | 630 | 200 | 500 | 180 |
| 4 | >>1300 | 1170 | >>1300 | 1130 |

A review of the data shows that the gold wire ball bond to the aluminum bonding pad on the devices are degraded (loss of physical bonding strength) by the presence of the flame-retardant ingredients (brominated resin of the bis-A type and antimony trioxide) in the plastic encapsulant under the high moisture environment of the autoclave. Specifically, the presence of antimony trioxide is found to be the overriding factor in causing ball lift, with the brominated resin playing a secondary role and only when the antimony content is lowered. When both of these ingredients are absent

TABLE 4

| molding compound | Examples | | | |
|---|---|---|---|---|
| | 6 | 7 | 8 | 9 |
| Brominated Resin | Brominated* Ether | Brominated Ether | Bren TM | Bren TM |
| Bromine in resin (%) | .60 | .60 | .895 | .895 |
| Antimony Trioxide (%) | 2.4 | — | 0.80 | — |
| Antimony Pentoxide (%) | — | 2.4 | — | 0.80 |

*The brominated resin is a tetrabromobis-phenol-A glycidyl ether resin with a softening point of 70-80° C. determined by Durran's method, an epoxy equivalent weight of 450-470, and 49 percent by weight of bromine.

EXAMPLE 10

The properties of the cured encapsulants of Examples 6-9 are further determined by total burn times of 1/16" bar according to UL-94V-0. The test results are summarized in Table 5.

TABLE 5

| | 1/16" Bars | | | |
|---|---|---|---|---|
| Example # | 1st Burn/2nd Burn/Burn Time | | Total Burn Time | 94V-0 Status |
| 6 | 0 | 6 | 19 sec | Pass |
| | 0 | 2 | | |
| | 2 | 0 | | |
| | 0 | 6 | | |
| | 1 | 2 | | |
| 7 | 4 | 6 | 28 | pass |
| | 0 | 2 | | |
| | 2 | 5 | | |
| | 2 | 2 | | |
| | 3 | 2 | | |
| 8 | 2 | 5 | 54 | Fail+ |
| | 1 | 5 | | |
| | 2 | 4 | | |
| | 0 | 3 | | |
| | 2 | 30 | | |
| 9 | 2 | 30 | 88 | Fail+ |
| | 8 | 2 | | |
| | 3 | 6 | | |
| | 5 | 4 | | |
| | 3 | 25 | | |

+The encapsulated device failed the UL-94V-0 test for 1/16" bar because only 0.89% of bromine (2.5% of Bren TM) is used in the molding compound. The encapsulated device will pass the UL-94V-0 test if ⅛" bar or at least 1.0% of bromine is used in the molding compound.

In contrast to prior art teachings, the data in Table 5 shows antimony pentoxide give poorer flame-retardance relative to antimony trioxide as measured by (UL-94V-0) total burn times of 1/16" bar.

EXAMPLE 11-12

Figure 2:
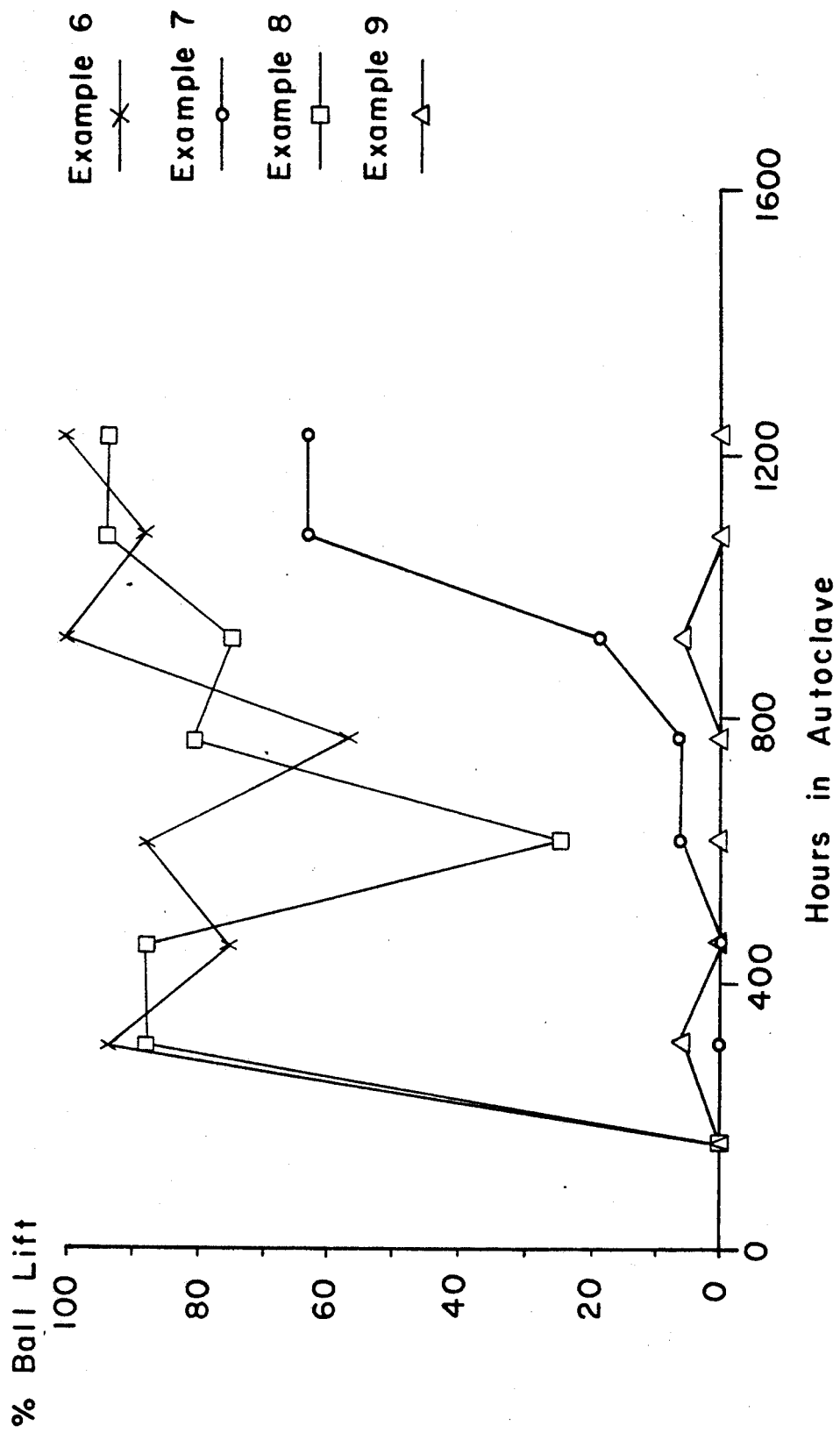
FIG. 2 describes test results of the ball lift (autoclave) test on molded devices (Examples 6–9) as a function of time and the estimated hours of 50% occurrence of ball lift at 30 psi.

The molded devices (Examples 6-9) are subjected to the ball lift (autoclave) test as described in Example 5. The test results as a function of time and the estimated hours of 50% occurrence of ball lift at both 15 and 30 psi conditions are summarized in Table 6 and FIGS. 1-2.

TABLE 6

LF412R - Bond Strength and Ball Lift

| Example | Description | Hours to 50% Pull Strength | | Hours to 50% Ball Lift | |
|---|---|---|---|---|---|
| | | 15 psi | 30 psi | 15 psi | 30 psi |
| 6 | | 1430 | 300 | 1430 | 280 |
| 7 | | >>1500 | ~1100 | >>1500 | ~1000 |
| 8 | | >1500 | 400 | −1530 | 370 |
| 9 | | >>1500 | >>1200 | >>1500 | >>1200 |

A review of the data shows that when antimony pentoxide is used in place of antimony trioxide, the ball lift problem is either delayed or it can not be detected at all, depending on the brominated resin used. The two samples with antimony pentoxide (7 and 9) show much reduced ball lift compared to samples 6 and 8. Also, sample 9 shows no ball lift out to 1200 hours at both 15 and 30 psi, while the comparable sample (8) with antimony trioxide shows 50% ball lift in 370 hours at 30 psi.

EXAMPLE 13

National Semiconductor LF412 operational amplifiers are encapsulated with encapsulants described in Examples 6-9. A group of about 40 of these molded packages (14 pin dual in-line) are subjected to the live device performance test.

The results of the live device test are summarized in Table 7.

TABLE 7

Live Device Performance at 30 psi, no bias of LF412 Operational Amplifiers in 14 pin DIP packages encapsulated with molding compounds from Examples 6-9

| Examples | 6 | 7 | 8 | 9 |
|---|---|---|---|---|
| Initial Number of Sample Devices | 37 | 38 | 40 | 38 |
| Hours | Cumulative Number of Failures | | | |
| 0 | 0 | 0 | 0 | 0 |
| 44 | 0 | 0 | 0 | 0 |
| 154 | 0 | 8 | 0 | 0 |
| 198 | 1 | 22 | 0 | 2 |
| 286 | 2 | 23 | 1 | 2 |
| 352 | 2 | 26 | 1 | 2 |
| 440 | 3 | 28 | 2 | 3 |
| 506 | 3 | 32 | 2 | 3 |
| 594 | 4 | No | 2 | 3 |
| 660 | 5 | Further | 2 | 3 |
| 748 | 5 | Testing | 4 | 3 |
| 792 | 5 | | 4 | 3 |
| 924 | 18 | | 13 | 9 |
| 1056 | 19 | | 13 | 9 |
| 1210 | 22 | | 13 | 9 |
| 1364 | 28 | | 19 | 11 |
| 1518 | No | | 22 | 12 |
| 1672 | Further | | 23 | 12 |
| 1826 | Testing | | 28 | 12 |
| 1980 | | | No | 15 |
| 2134 | | | Further | 18 |
| 2442 | | | Testing | 19 |
| 2750 | | | | 19 |
| 3036 | | | | 19 |

A review of the data shows that the combination of Bren TM and antimony pentoxide in the improved molding compound encapsulated device gives superior live-device performance than the other combination of brominated resin and antimony trioxide/pentoxide.

EXAMPLE 14

On a pilot plant scale epoxy encapsulants are prepared from the formulation indicated in Table 8. The improved molding compound is then molded onto test devices as in Example 5.

TABLE 8

| Description | Example 14 |
|---|---|
| Epoxy Cresol Novolac resin | 13.26 |
| epoxy resin (BREN TM) - containing bromine (%) | 1.36+ |
| antimony pentoxide | 0.75++ |
| Carbon black coloring | 0.20 |
| Phenol Novolac Hardener | 9.10 |
| Fused Silica (SiO$_2$) filler | 71.39 |
| Silane coupling agent | 0.70 |
| catalysts | 0.35 |
| wax lubricants | 0.45 |

+The 1.36% of bromine equivalents to 3.8% Bren TM
++The level of 0.75% commercial antimony pentoxide represents an actual level of 0.67-0.68%

EXAMPLE 15

The properties of cured encapsulants of Example 14 are tested according to UL-94V-0 (one sixteenth inch). The test results are summarized in Table 9.

TABLE 9

| | 1st Burn | 2nd Burn | |
|---|---|---|---|
| Example 14* | 0 | 2 | Pass |
| | 0 | 0 | |
| | 1 | 1 | |
| | 0 | 0 | |
| | 0 | 0 | |

*Example 14 is molded at 350° F., postcured six hours at 175° C.

EXAMPLE 16

Figure 3:
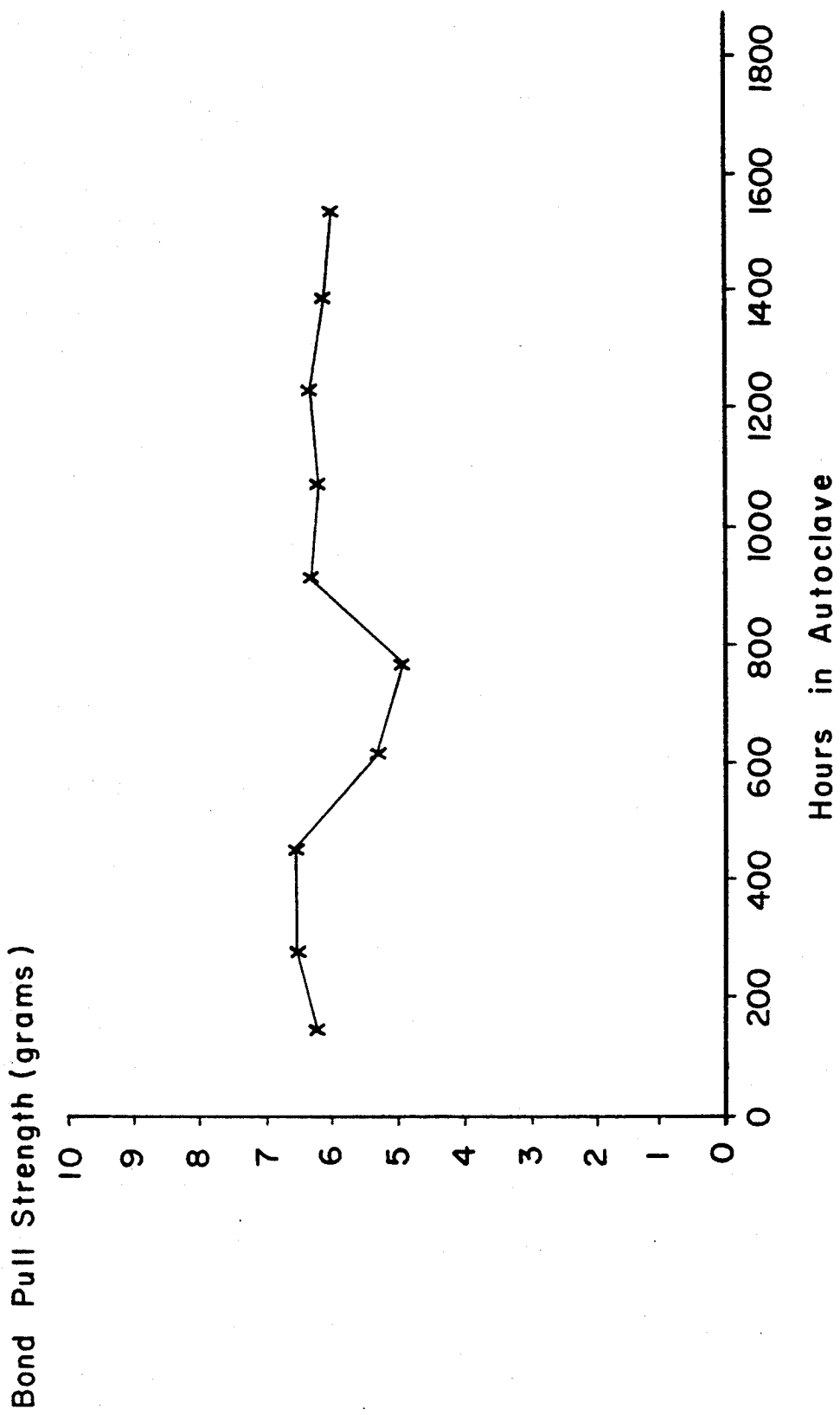
FIG. 3 describes test results of the ball lift test on the encapsulated devices Example 14.

The encapsulated device from Example 14 is subjected to the ball lift test. Test results are summarized in FIG. 3. The test results show that the cured encapsulant of Example 14 does not cause degradation of the wire bond strength after 1500 hours at 135° C., 30 psi steam.

EXAMPLE 17

Figure 4:
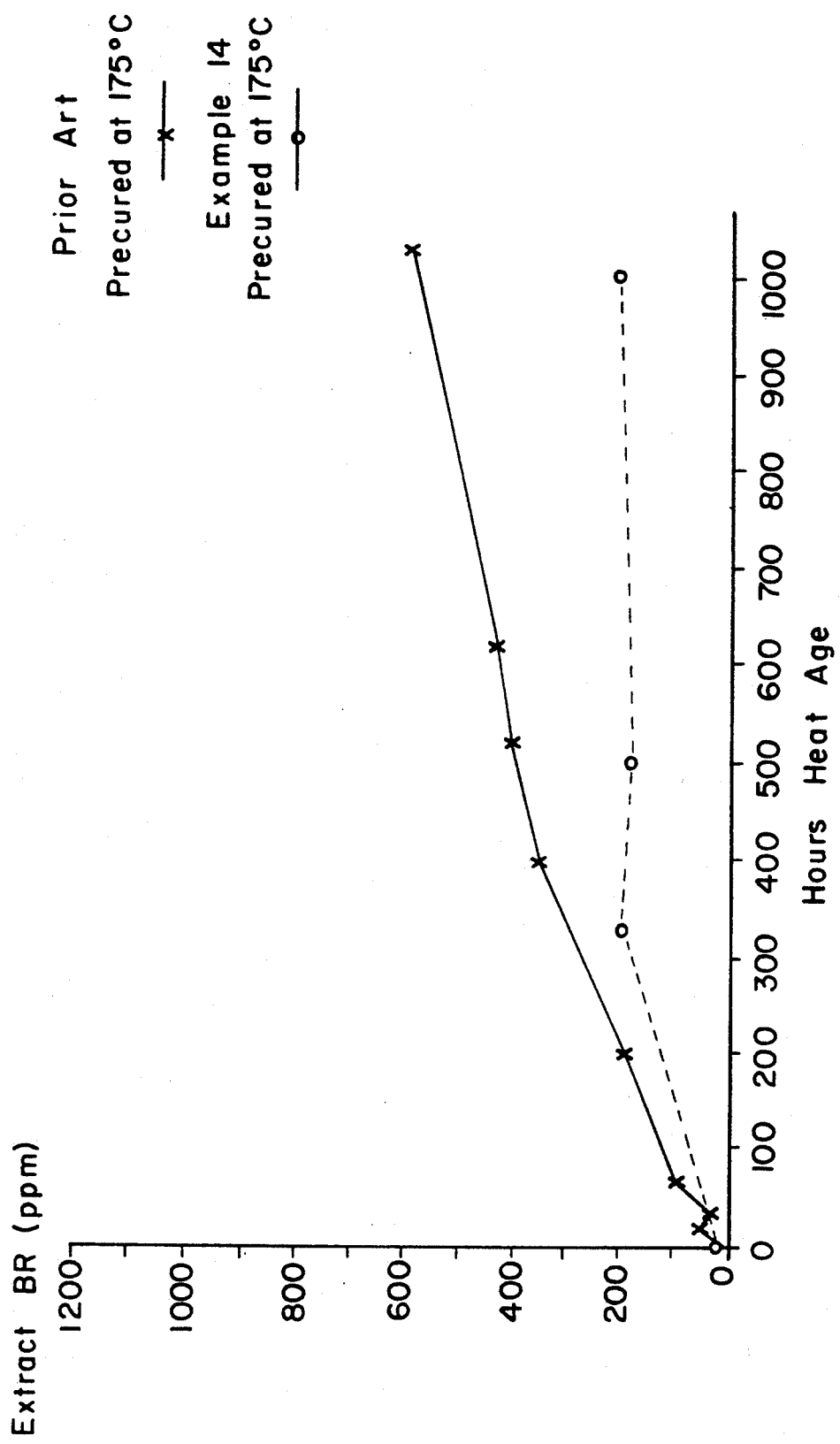
FIG. 4 describes test results of the bromine extraction test performed at 200° C. upon the molding compound from Example 14.

The molding compound from Example 14 is subjected to the bromine extraction test. Test results are summarized at FIG. 4.

The test results show that the heat cured molding compound of Example 14 after heat aging at 200° C. for 500 hours releases bromine ion extracted by water of 175 ppm concentration. This is far lower than the 400 ppm water extractable bromine ion concentration released by encapsulant of prior art epoxy molding compounds under the same condition.

EXAMPLE 18

Figure 5:
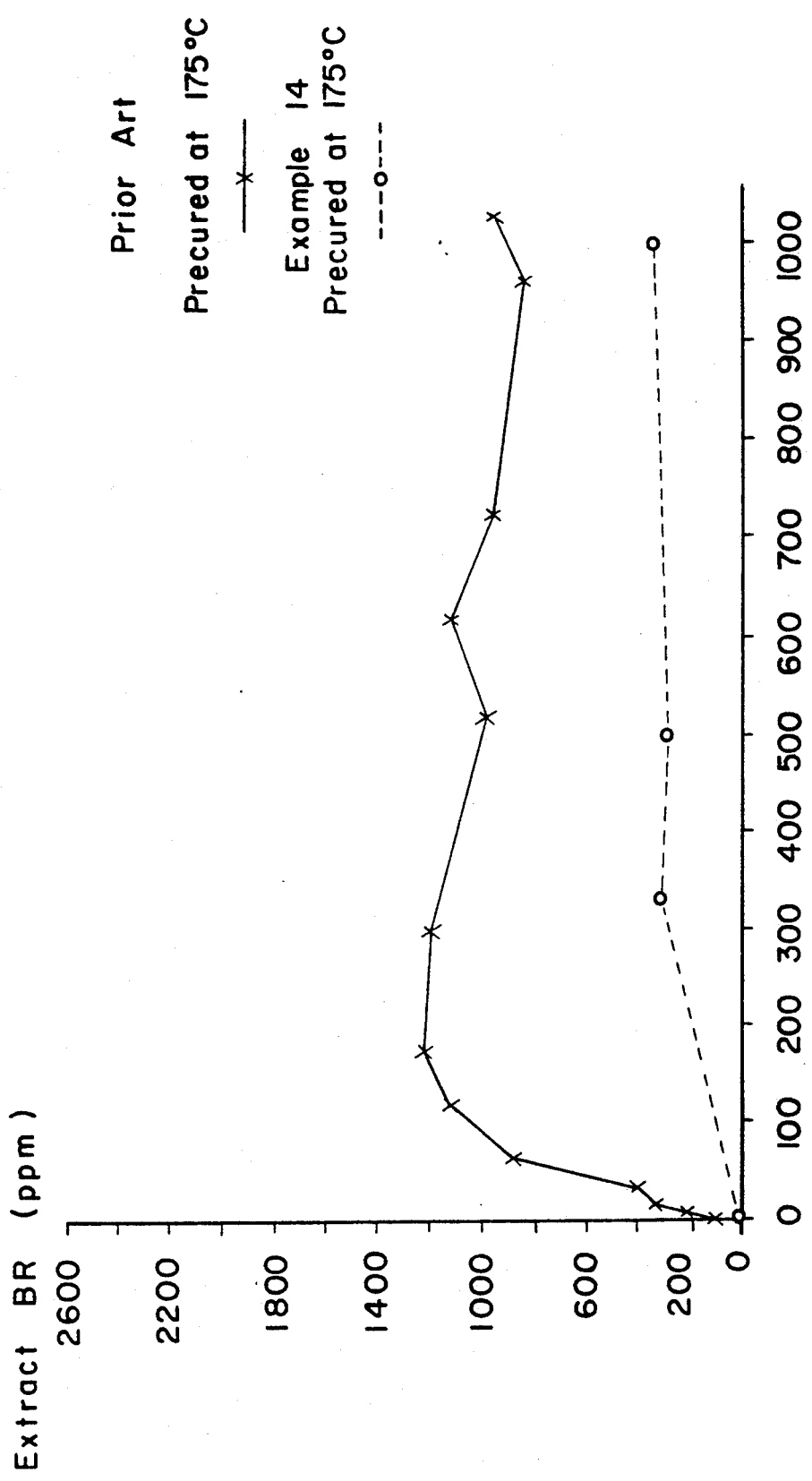
FIG. 5 describes test results of the bromine extraction test performed at 240° C. upon the molding compound from Example 14.

The bromine extraction test as described in Example 17 was repeated for the molding compound from Example 14 at 240° C. Test results are summarized in FIG. 5. The test results show that the heat cured encapsulant molding compound of Example 14 after heat aging at 240° C. for 500 hours releases bromine ion extracted by water of 240 ppm concentration. This is far lower than the 1000 ppm water extractable bromine ion concentration released by encapsulant of prior art epoxy molding compound under the same condition.

EXAMPLE 19-21

Epoxy encapsulants (Examples 19-21) using 0.75% $Sb_2O_3$, 0.50% $Sb_2O_3$/0.25% $Sb_2O_5$ and 0.25% $Sb_2O_3$/0.50% $Sb_2O_5$ respectively are prepared in the laboratory. Examples 19-21 are of similar compositions as used in Example 14 except that antimony trioxide or a mixture of antimony trioxide/pentoxide are used in place of antimony pentoxide.

EXAMPLE 22

The epoxy molding compounds prepared in Examples 19-21 are molded on test devices as in Example 14.

Figure 6:
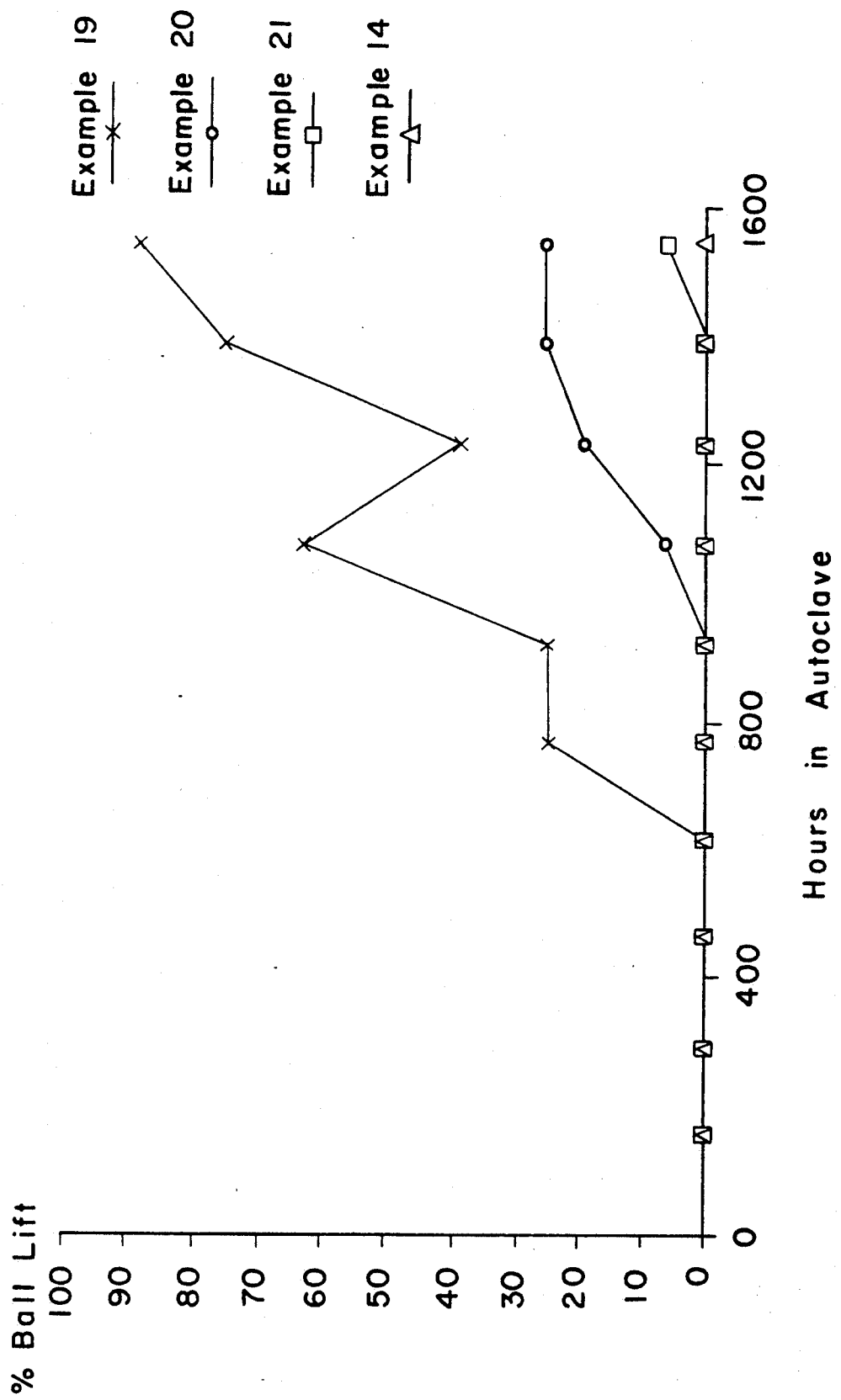
FIG. 6 describes test results of the ball lift (autoclave) test on the encapsulated devices Examples 14 and 19–21 as a function of time at 15 psi.
Figure 7:
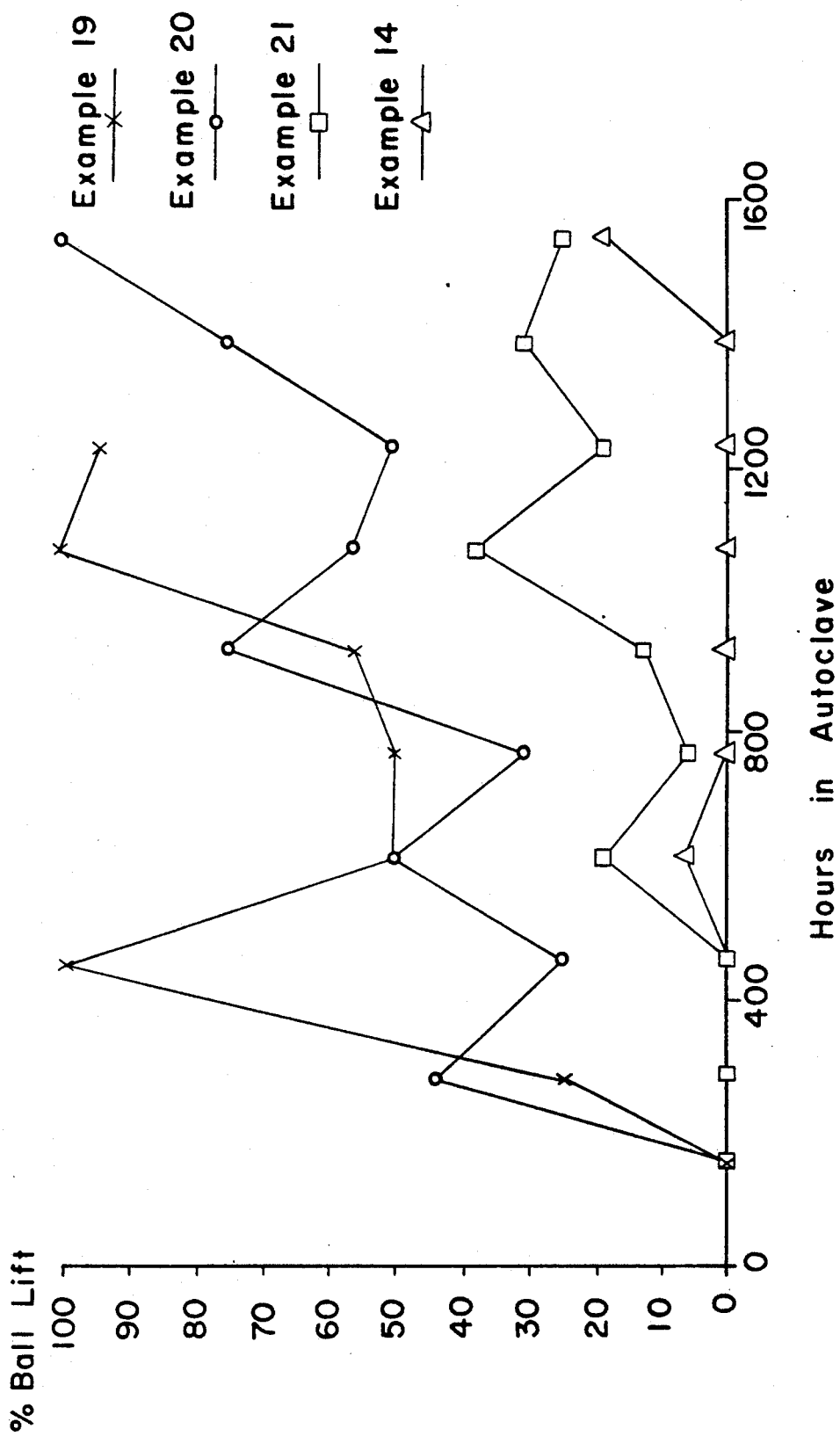
FIG. 7 describes test results of the ball lift (autoclave) test on the encapsulated devices Examples 14 and 19–21 as a function of time at 30 psi.

The encapsulated devices from Examples 14, 19-21 are subjected to the ball lift test as described in Example 5. Test results as a function of time at both 15 and 30 psi conditions are summarized in FIGS. 6 and 7 respectively. The improved epoxy molding compound as described in Example 14 containing 0.75% antimony pentoxide gives superior ball lift performance than the other combination of brominated resin and antimony trioxide/pentoxide mixtures.

EXAMPLES 23-25

Epoxy encapsulants are prepared from the formulations indicated in Table 10. The formulations are similar to that presented in Table 8 except for the content of antimony pentoxide and bismuth trioxide.

TABLE 10

| Description | Example 23 | Example 24 | Example 25 |
|---|---|---|---|
| Epoxy Cresol Novolac resin | 13.26 | 13.26 | 13.26 |
| epoxy resin (BREN TM) - containing bromine (%) | 1.36+ | 1.36+ | 1.36+ |
| bismuth trioxide | — | 1.6 | 1.6 |
| antimony pentoxide | 0.4 | — | 0.4 |
| Carbon black coloring | 0.20 | 0.20 | 0.20 |
| Phenol Novolac Hardener | 9.10 | 9.10 | 9.10 |
| Fused Silica ($SiO_2$) filler | 71.39 | 71.39 | 71.39 |
| Silane coupling agent | 0.70 | 0.70 | 0.70 |
| catalysts | 0.35 | 0.35 | 0.35 |
| wax lubricants | 0.45 | 0.45 | 0.45 |

+The 1.36% of bromine equivalents to 3.8% Bren TM

EXAMPLE 26

National Semiconductor LF412 operational amplifiers are encapsulated with encapsulants described in Examples 23-25. A group of about 40 of these molded packages (14 pin dual in-line) are subjected to the live device performance test at 15 psi and no bias of the operational amplifiers.

The results of the live device test are summarized in Table 11.

TABLE 11

Live Device Performance at 15 psi, no bias of LF412 Operational Amplifiers in 14 pin DIP packages encapsulated with molding compounds from Examples 23-25

| Examples | 23 | 24 | 25 |
|---|---|---|---|
| Initial # of Sample Devices | 38 | 37 | 36 |
| Hours | \multicolumn{3}{c}{Cumulative Number of Parametric Failures} | | |
| 44 | 1 | 1 | 0 |
| 88 | 2 | 1 | 0 |
| 176 | 2 | 1 | 0 |
| 242 | 5 | 1 | 0 |
| 330 | 6 | 1 | 0 |
| 396 | 7 | 3 | 0 |
| 440 | 10 | 5 | 0 |
| 506 | 11 | 5 | 0 |
| 594 | 14 | 10 | 3 |
| 660 | 20 | 16 | 7 |
| 748 | 24 | 17 | 11 |
| 814 | No further testing | 28 | 17 |
| 924 | | No further testing | 17 |
| 1056 | | | 20 |
| | | | No further testing |

The test data indicates that the combination of antimony pentoxide and bismuth trioxide at the same level of Bren TM (Example 25) gives superior live-device performance than the formulation having antimony pentoxide alone or bismuth trioxide alone.

Furthermore, additional burn time and ball lift testing of Example 25 indicates the formulation maintains adequate flame retardancy and adequate resistance to ball-bond degradation comparable to formulations having antimony pentoxide alone.

The foregoing examples are intended to illustrate without limitation, the improved flame retardant epoxy molding compound, method and encapsulated device. It is understood that changes and variation can be made therein without departing from the scope of the invention as defined in the following claims.

What is claimed is:

1. A semiconductor device encapsulated by a method comprising the using of a thermosetting epoxy molding compound in a liquid state in a mold surrounding a semiconductor device, said epoxy molding compound comprising:
   (a) about 5-25 percent by weight of compound of an epoxy;
   (b) about 4-20 percent by weight of compound of a phenol-derived or a substituted phenol derived resin hardener;
   (c) an effective amount of a catalyst for the reaction between said epoxy resin and said hardener in an amount of from about 0.1 to 10% by weight of the combined weight of epoxy and hardener;
   (d) an effective amount of a mold release agent for the release of the cured molding compound from a mold in an amount of between about 0.01 and about 2 percent by weight of compound;
   (e) between about 50 and 85 percent by weight of compound of a filler; and
   (f) a flame retardant system of:
      (1) from about 0.4% to 0.8% antimony pentoxide by weight of molding compound;
      (2) from about 0.01-1.0 percent sodium by weight of antimony pentoxide compound;
      (3) a reactive organic compound containing at least about 1.0% of bromine by weight of molding compound which may include one or more of the other components; and
      (4) from about 1.60 to about 4.0% bismuth trioxide by weight of molding compound.

2. A semiconductor device according to claim 1, wherein said hardener is a phenolic novolac.

3. A semiconductor device according to claim 1, wherein said epoxy molding compound comprises at least about 50 weight percent of an inorganic filler.

4. A semiconductor device according to claim 1, wherein said reactive bromine-containing organic compound is a polyglycidylether of bromophenol-formaldehyde novolac.

5. A semiconductor device according to claim 1, wherein said reactive organic compound contains about 1.0 to 1.8 percent of bromine by weight of the molding compound.

6. A semiconductor device according to claim 1, wherein said flame retardant system contains 0.03 to 0.06 percent of sodium by weight of antimony pentoxide.

7. A semiconductor device according to claim 1, wherein said flame retardant system contains about 1.60–3.20 percent of bismuth trioxide by weight of the molding compound.

* * * * *